United States Patent [19]
So

[11] Patent Number: 5,998,266
[45] Date of Patent: Dec. 7, 1999

[54] METHOD OF FORMING A SEMICONDUCTOR STRUCTURE HAVING LATERALLY MERGED BODY LAYER

[75] Inventor: Koon Chong So, San Jose, Calif.

[73] Assignee: MagePower Semiconductor Corp., San Jose, Calif.

[21] Appl. No.: 08/781,934

[22] Filed: Dec. 19, 1996

[51] Int. Cl.[6] .................................................. H01L 21/336
[52] U.S. Cl. .......................... 438/270; 438/530; 438/555; 438/589
[58] Field of Search ................................. 438/270, 271, 438/272, 268, 299, 301, 589, 430, 449, 451, 420, 545, 529, 527, 524, 530, 555; 257/330, 331, 332; 148/DIG. 126

[56] References Cited

U.S. PATENT DOCUMENTS

| | | | |
|---|---|---|---|
| 4,047,975 | 9/1977 | Widmann | 438/348 |
| 4,503,598 | 3/1985 | Vora et al. | 438/274 |
| 4,648,174 | 3/1987 | Temple et al. | 438/514 |
| 4,999,309 | 3/1991 | Buynoski | 438/395 |
| 5,283,201 | 2/1994 | Tsang et al. | 438/270 |
| 5,380,670 | 1/1995 | Hagino | 438/270 |
| 5,576,567 | 11/1996 | Mori | 257/331 |
| 5,668,026 | 9/1997 | Lin et al. | 438/272 |
| 5,736,445 | 4/1998 | Pfirsch | 438/275 |

*Primary Examiner*—Michael Trinh
*Attorney, Agent, or Firm*—Kam T. Tam

[57] ABSTRACT

A trenched gate MOSFET (metal oxide semiconductor field effect transistor) structure is fabricated via a novel process which includes the step of using a common mask serving the dual role as a mask for the body layer formation and as a mask for trench etching. The common mask defines an patterned oxide layer which includes a plurality of openings at a predetermined distance away from the scribe line of the MOSFET structure. During fabrication, material of the body layer is implanted through the openings of the patterned oxide layer. Thereafter, the implanted material is side-diffused and merged together under a drive-in cycle as one continuous body layer. Using the same patterned oxide layer as a shield, trenches are anisotropically etched in the substrate. The MOSFET structure as formed requires no separate mask for delineating the active body region away from the scribe line, resulting reduction of fabrication steps. The consequential benefits are lower manufacturing costs and higher production yields.

11 Claims, 18 Drawing Sheets

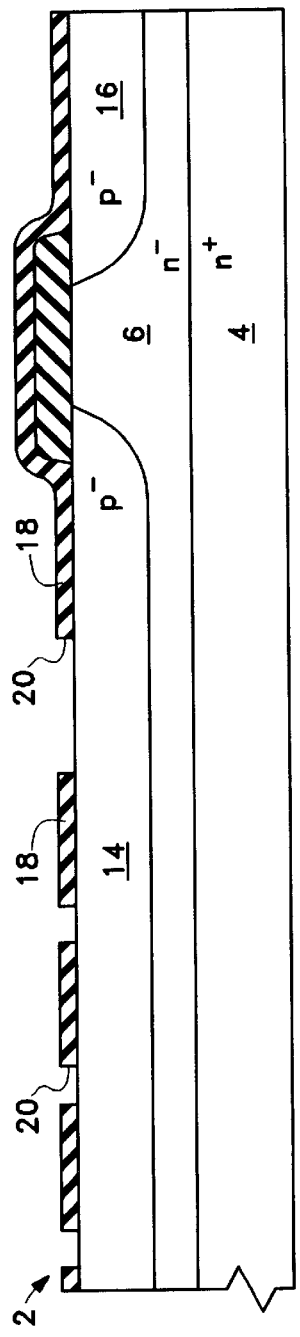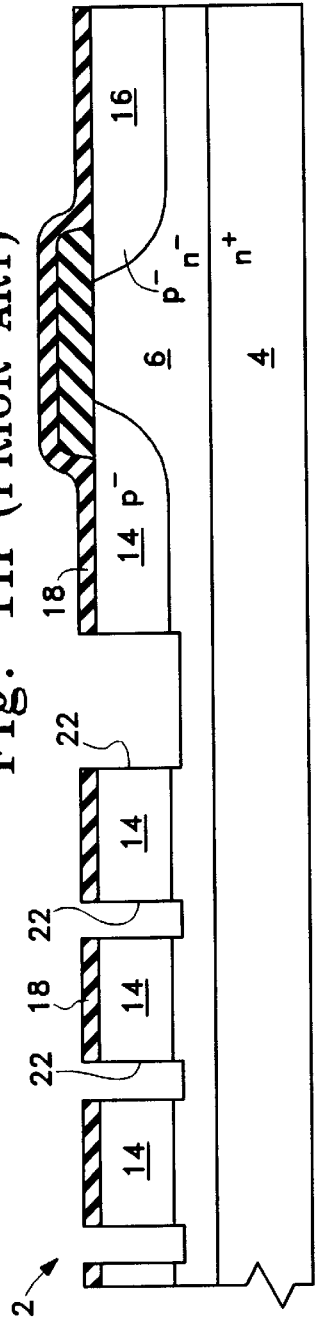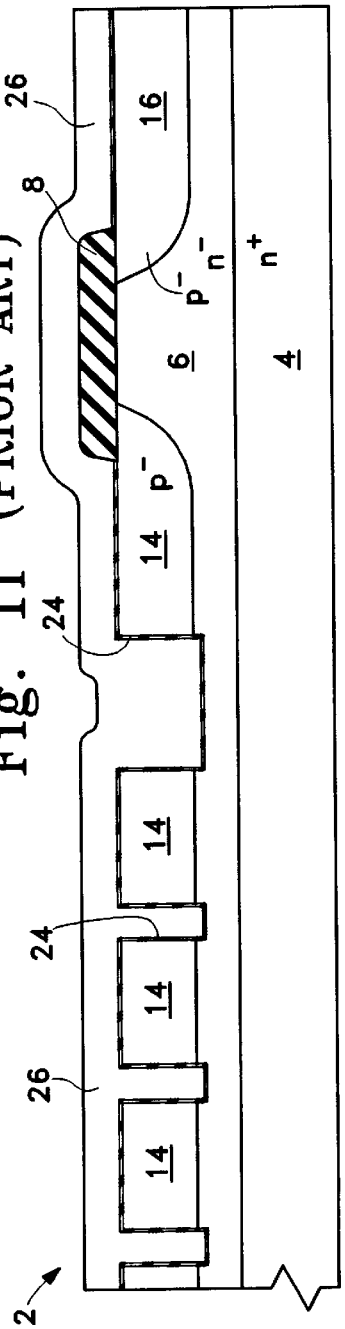

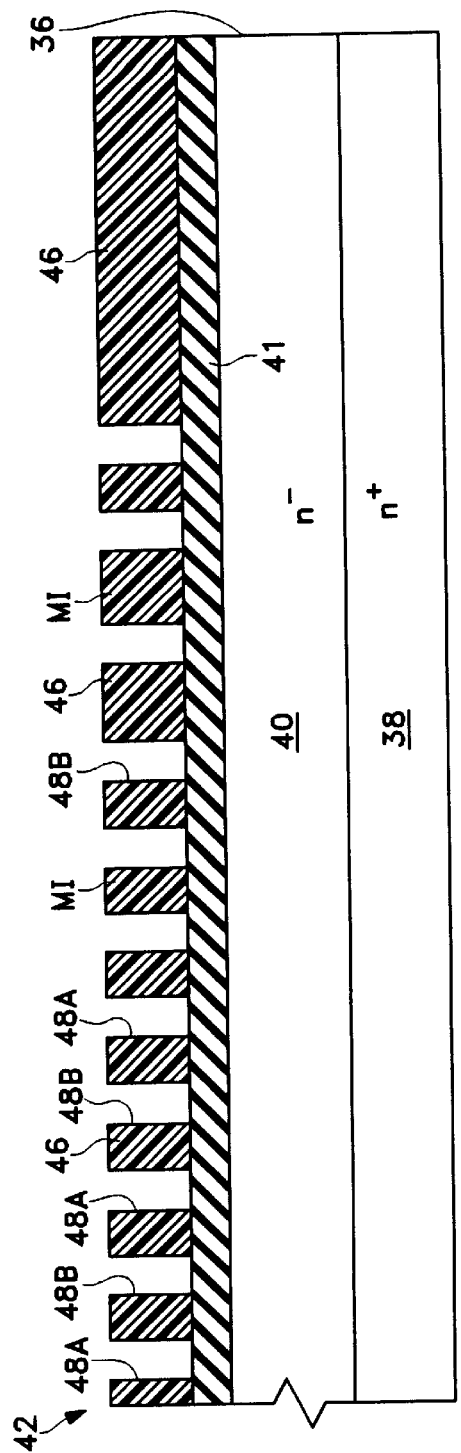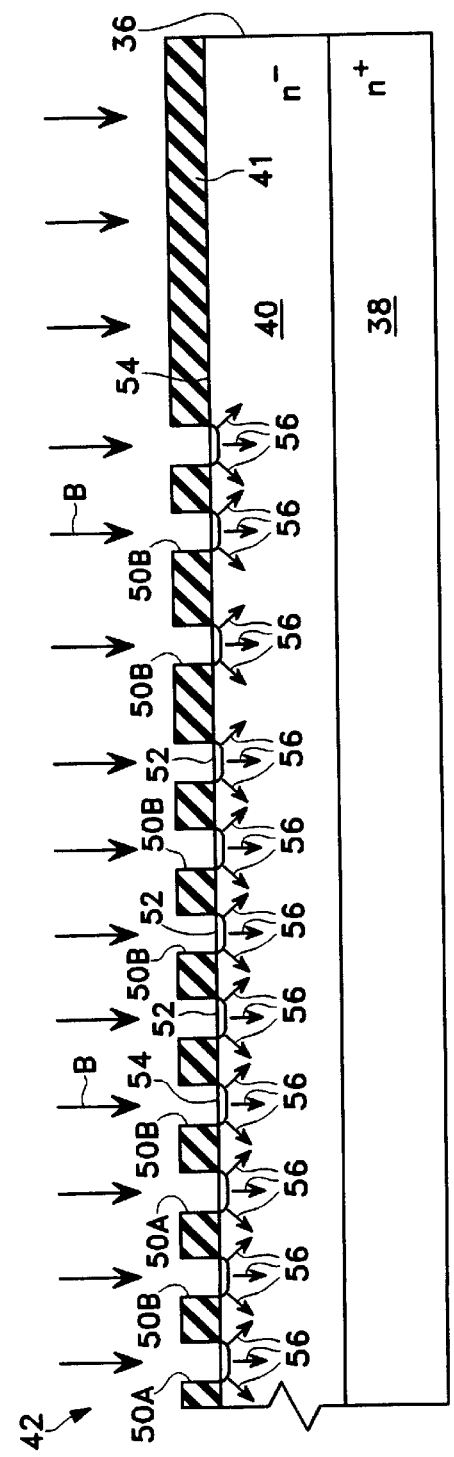

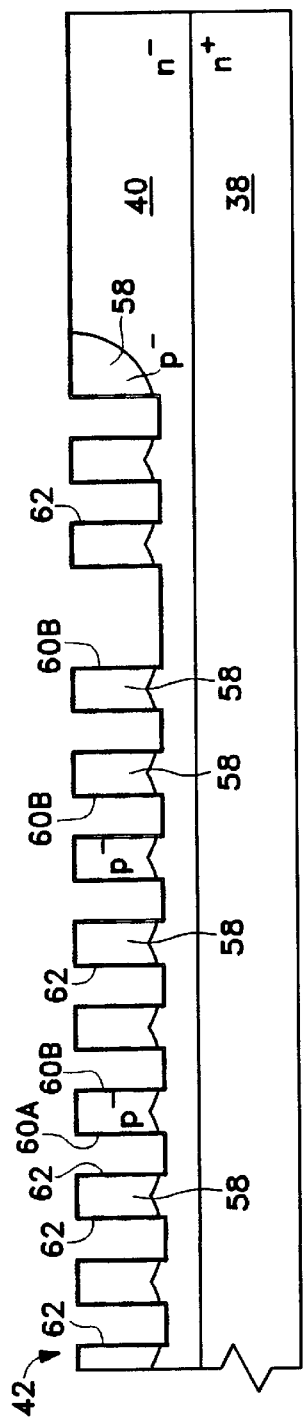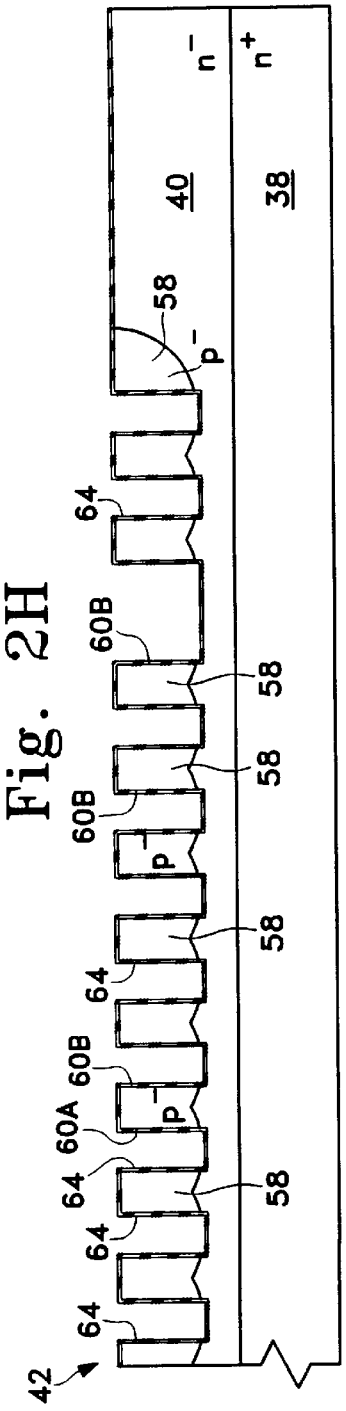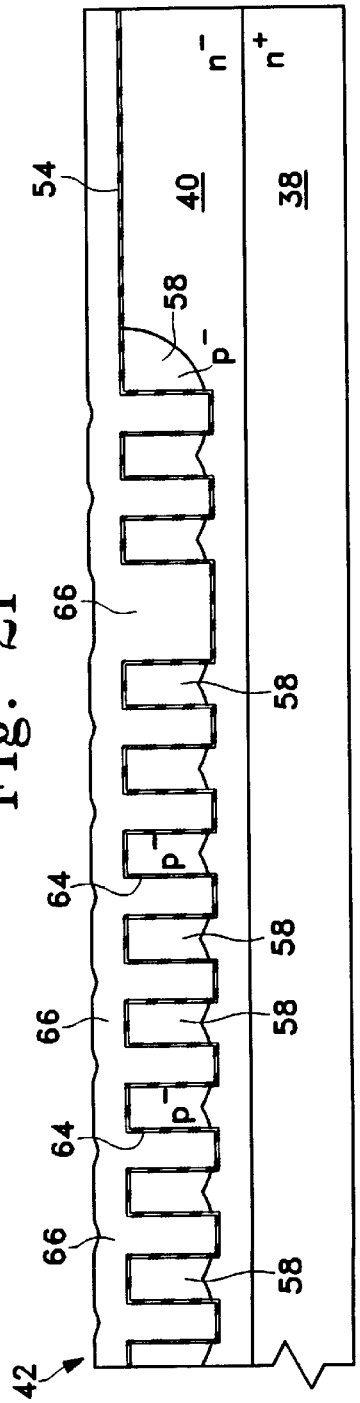

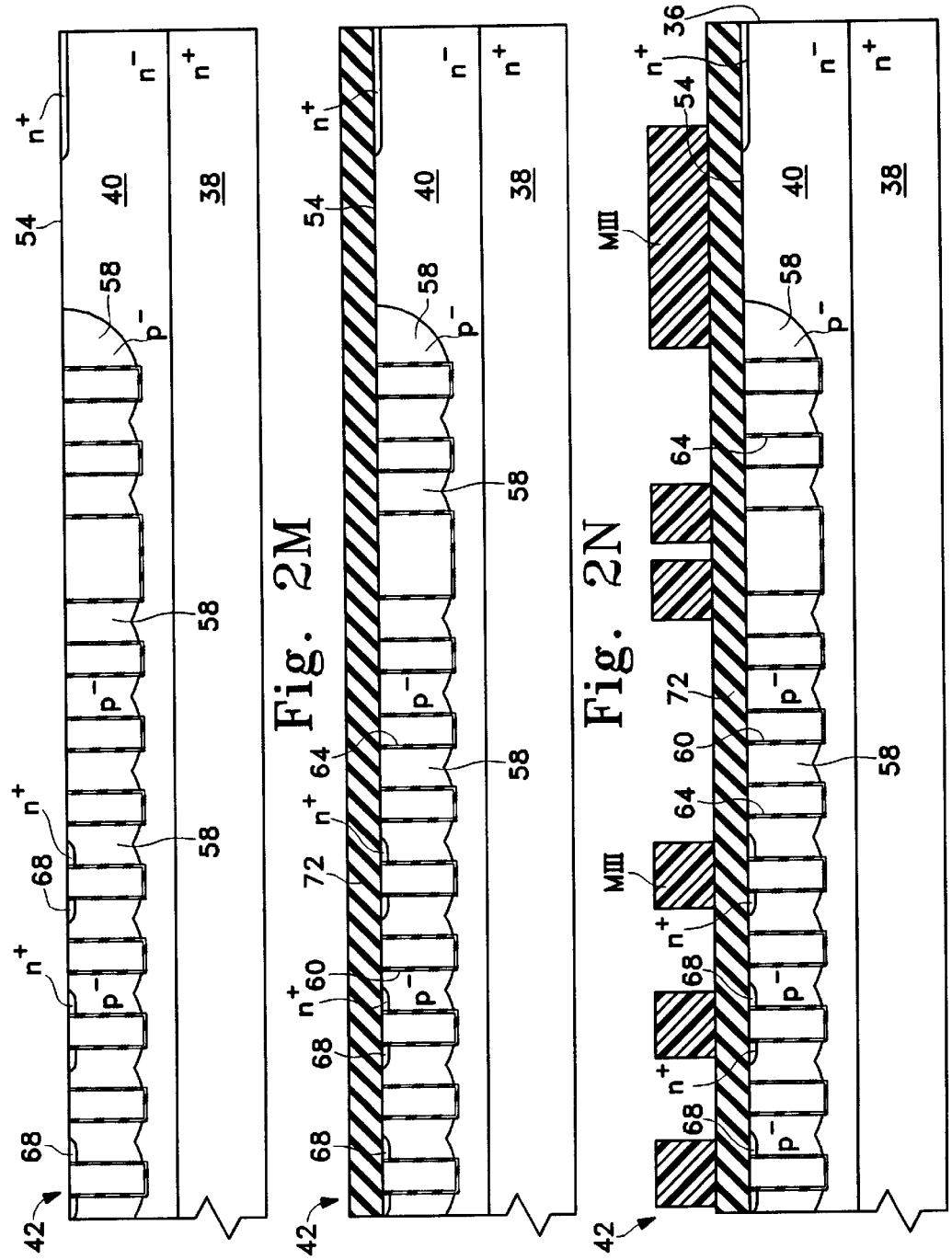

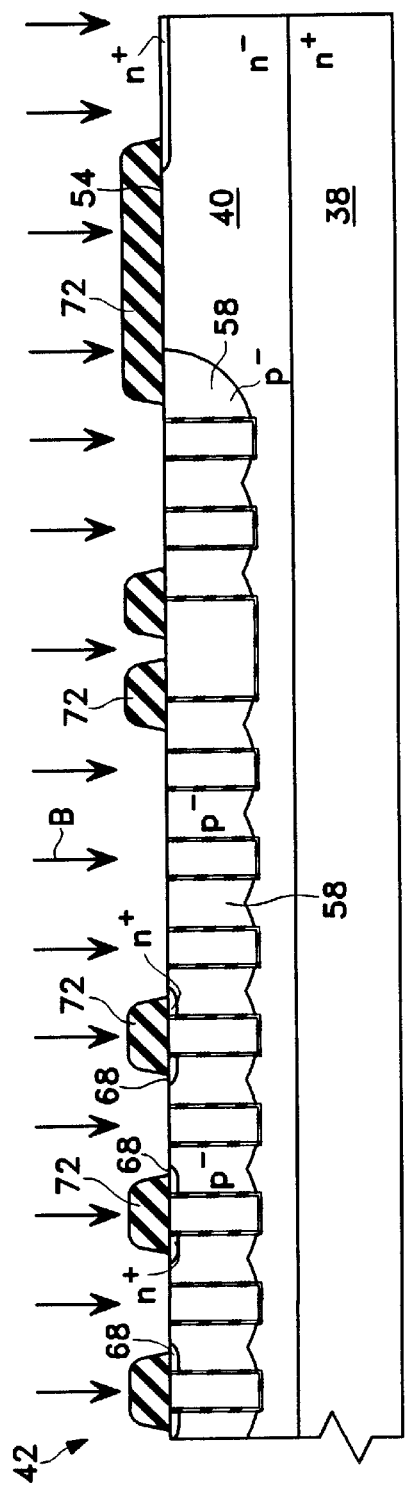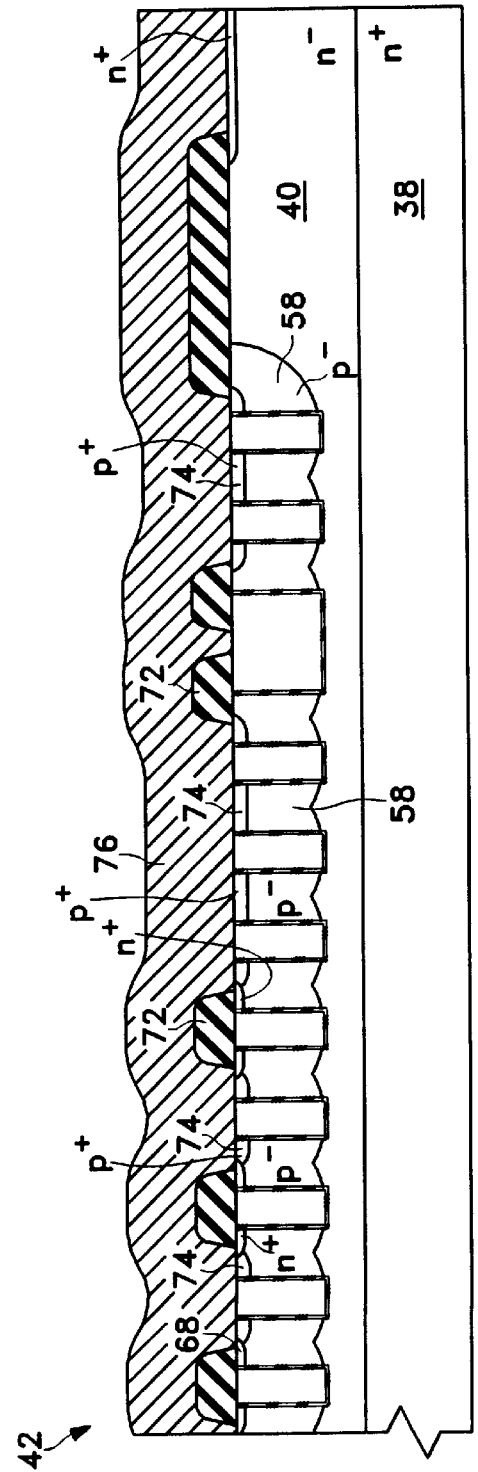

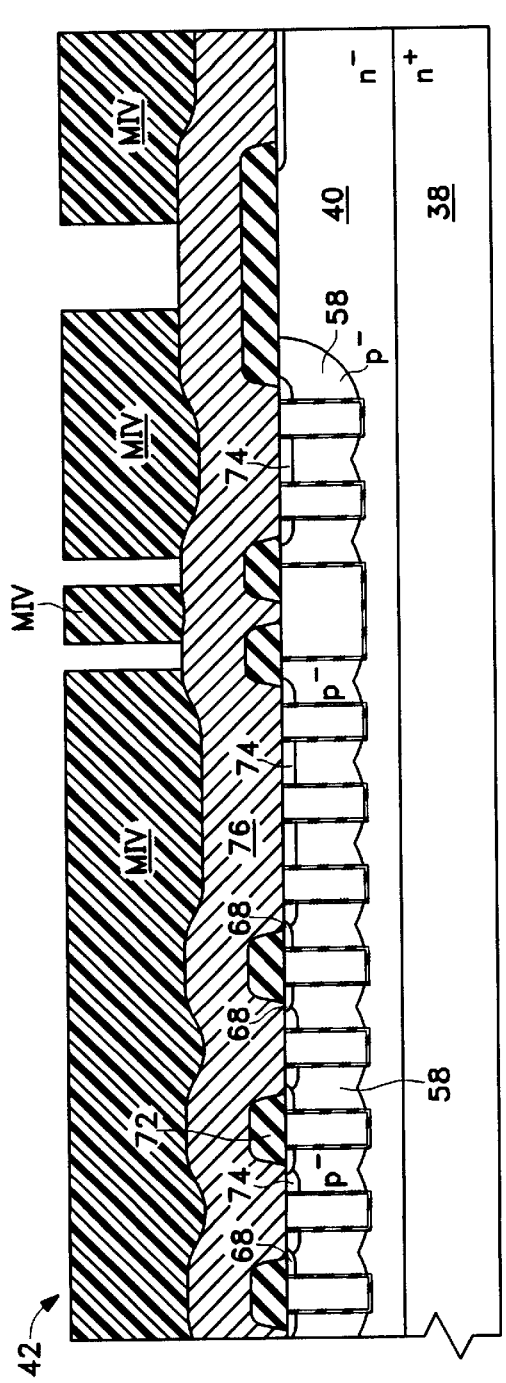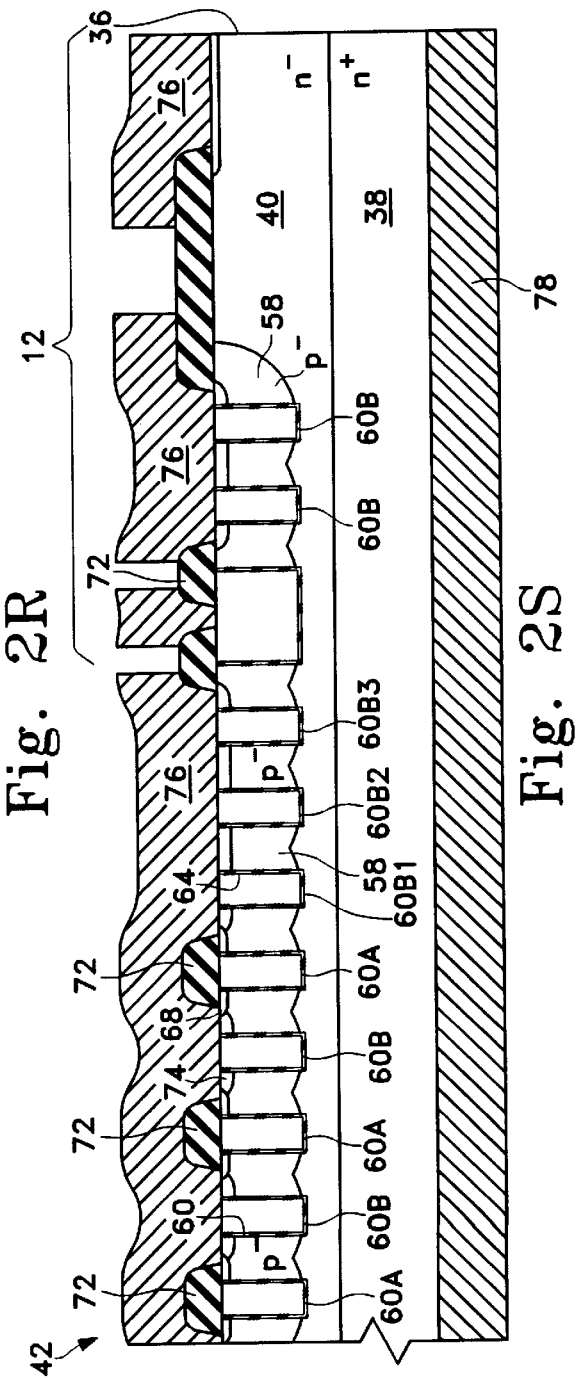
Fig. 2R
Fig. 2S

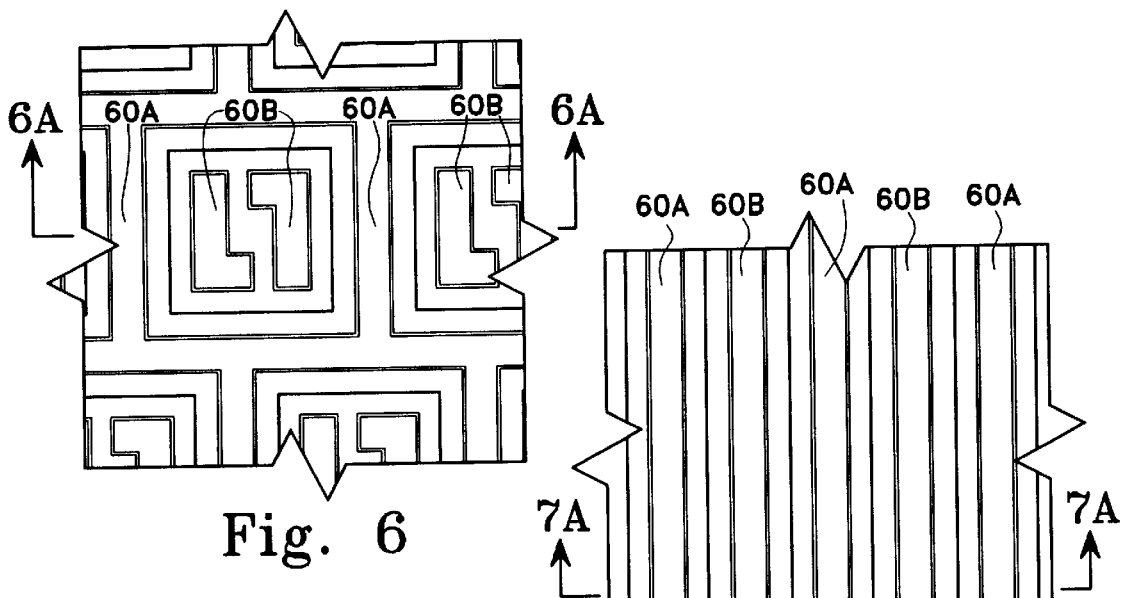
Fig. 6
Fig. 7
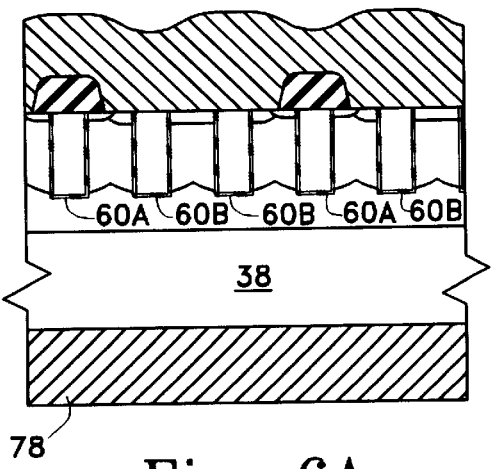
Fig. 6A
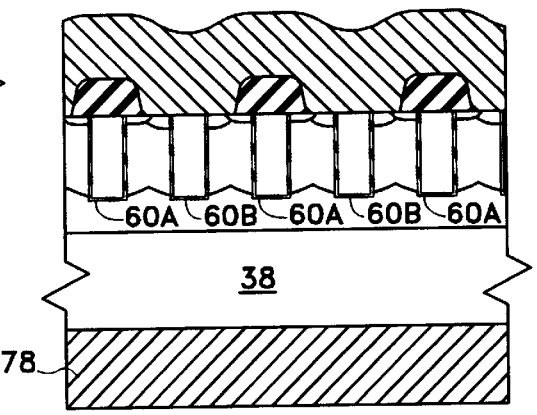
Fig. 7A

METHOD OF FORMING A SEMICONDUCTOR STRUCTURE HAVING LATERALLY MERGED BODY LAYER

BACKGROUND OF THE INVENTION

1. Field of the Invention

The present invention relates generally to microelectronic circuits, and more particularly, to trenched gate MOSFETs (Metal Oxide Semiconductor Field Effect Transistors) having laterally merged body layers formed by a process with reduced masking sequences.

2. Description of the Related Art

Power semiconductor devices have long been used as replacement for mechanical relays in various applications. Development in semiconductor technology enables these power devices to operate with high reliability and performance. However, modern day instruments are now built at a miniaturized scale with lower power consumption. These instruments, such as fast switching power supplies, high-frequency ballasts, robotics controls and various portable machines, all require power devices to operate under certain stringent requirements. Accordingly, special criteria have to be met in the design and manufacturing of these devices. One area that shows prominence is the fabrication of power metal oxide semiconductor field effect transistors (MOSFETs) using trenched gates.

In a trenched gate MOSFET array, intersecting trenches which define a plurality of cells are formed on a silicon substrate. The trenches are filled with conductive material separated from the silicon substrate with a thin layer of insulating material. There are also other diffusion layers, such as the body and source layers, of different impurity types and concentration deposited in the semiconductor substrate. As arranged, the conductive and insulating materials in the trenches constitute the gate and gate oxide layer, respectively, of the MOSFET. In addition, the perimeter and the depth of the cell correspond to the respective channel width and depth of each MOSFET cell.

Power MOSFETs with trenched gates provide many advantages. To begin with, the channels of the MOSFETs are arranged in a vertical manner, instead of horizontally as in most planar configurations. The consequential benefit is that a higher degree of integration on a semiconductor substrate can be realized. More importantly, since the channel direction is vertical, the lateral current paths are basically eliminated. As a result, the overall channel resistance is reduced. Reduction in channel resistance substantially curtails ohmic loss during the power-on state of the MOSFET, which in turn provides lower power consumption and further alleviates heat dissipation.

Heretofore, fabricating a trenched gate MOSFET has involved a substantial number of fabrication steps in the manufacturing process. To highlight the number of masks and the associated steps involved, FIGS. 1A–1R schematically illustrate the conventional process required to fabricate a trenched MOSFET.

The fabrication process starts with providing a n-type base silicon wafer 4 as shown in FIG. 1A. An epitaxial layer 6 with a predetermined resistivity is then grown atop the base wafer 4 as shown in FIG. 1B. A field oxide layer 8 is thereafter deposited on the top of the epitaxial layer 6. The resultant structure 2 up to this step is shown in FIG. 1C.

A first mask M1, called the active mask, which defines the active area 10 and the termination area 12 is disposed atop the filled oxide layer 8 as shown in FIG. 1D. The active mask M1 is a photoresist layer capable of being patterned by the conventional photolithographic process. After proper patterning, using the patterned first mask M1 as a shield, either the method of dry etch or wet etch is employed to define the field oxide layer 8 as shown in FIG. 1E. The field oxide layer 8 defines an active body layer 14 (formed by the next step) which has to be at a distance d away from the scribe line 36 of the structure 2. The scribe line 36 is a physical cut line separating the semiconductor dies in a finished wafer. The reason of this critical requirement will be explained later in this specification.

The method of ion implantation is then employed to form the active body layer 14 and the termination body layer 16. After a proper drive-in process, the active body layer 14 and the terminal body layer 16 are diffused sufficiently deep into the epitaxial layer 6. The resultant structure up to this step is shown in FIG. 1E.

Another layer of oxide 18 is then deposited on the top of the structure 2 as shown in FIG. 1F. A second mask M2, called the trench mask, is then spun on the top of the oxide layer 18. The second mask M2 is also made of photoresist material. After proper patterning and etching, the resultant structure 2 up to this step is shown in FIG. 1G. Using the trench mask M2 as a shielding mask, the oxide layer 18 is then etched to define a pattern with trench openings 20 in the oxide layer 18 as shown in FIG. 1H. The trench mask M2 is then removed. Using the patterned oxide 18 as a masking layer and via the method of either dry or wet etch, the structure 2 is then anisotropically etched to form trenches 22 in the epitaxial layer 6 as shown in FIG. 1I.

What follows is the formation of a gate oxide layer. First, the oxide layer 18 is removed. The trenches 22 are then lined with gate oxide 24 and are thereafter filled with polycrystaline silicon 26 as shown in FIG. 1J. The process of planazation is then employed to flatten the polycrystalline silicon 26 as shown in FIG. 1K. The polycrystalline silicon 26 is thereafter doped with phosphorous oxychloride ($POCl_3$) to assume a n-type conductivity. The resultant structure 2 up to this step is shown in FIG. 1K.

The next step is the formation of a source layer in the structure 2. First, the polycrystalline silicon 26 is further etched. A third photoresist mask M3, called the source blocking mask, is then laid on the top of the structure 2. After proper patterning, the resultant structure 2 up to this step is as shown in FIG. 1L. Arsenic (As) is then implanted through the M3 mask into the body layer. After a drive-in process, the source layer 28 is formed in the body layer 14 as shown in FIG. 1M. Thereafter, the third mask M3 is removed and a passivation oxide layer 30 is formed on the top of the structure 2 as shown in FIG. 1M.

A fourth photoresist mask M4, called the contact mask, is then laid atop the passivation oxide layer 30. After proper patterning, the resultant structure up to this step is shown in FIG. 1N. The process of contact etch is then performed. After the removal of the contact mask M4, the resultant structure 2 is covered with a patterned passivation oxide layer 30 as shown in FIG. 1O.

P-type material, such as boron, is then implanted and diffused into the structure 2 through the patterned passivation oxide layer 30, resulting in contact diffusion layers 29 formed in the structure 2 as also shown in FIG. 1O.

The step of metallization follows. A metal layer 32 is deposited atop the structure 2 by the sputtering process as shown in FIG. 1P. A fifth photoresist mask M5, called the metal mask, is then deposited and patterned on the top of the metal layer 32 as shown in FIG. 1Q. The metal layer 32 is then etched through the fifth mask M5. Furthermore, a drain metal layer 34 is deposited on the bottom side of the wafer 4. The resultant structure 2 up to this step is as shown in FIG. 1R.

Not shown in FIG. 1A–1R is the deposition of another masking step via a 6th mask M6, called the bonding pad mask, for the purpose of exposing selected areas of the metal layer 32 to the bonding wires, after a protective insulating layer is deposited atop the structure 2.

In the process of fabricating a trenched MOSFET device as depicted above, there are at least 6 photoresist masks, namely, M1–M6 involved. As with other thin-film microelectronic processes, it is always highly desirable to reduce the number of masks with the associated masking and patterning steps. The advantage of reducing the number of masks in the fabrication process is twofold. First, laying a mask on a semiconductor structure in the manufacturing process is relatively expensive, not merely in the cost of the mask itself but the various patterning and etching steps associated with the mask involved. Secondly, the more the number of masking and etching steps involved, the higher the chance of contamination of the structure and consequently the lower production yield of the final products. Accordingly, the costs saved by reducing a mask is beyond the prorated basis accorded by the reduced mask.

In the production of a trenched MOSFET device, there has been a long-felt need in the industry to curtail the number of masks and the associated fabrication steps involved, without sacrificing any device performance.

SUMMARY OF THE INVENTION

It is the object of the invention to provide a trenched gate MOSFET device built by a manufacturing process having reduced number of production steps, and consequently lower manufacturing costs, thereby providing higher production yield, yet without compromising any device performance.

The present invention meets the foregoing objectives by by providing a novel method of fabricating a trenched gate MOSFET (metal oxide semiconductor field effect transistor) structure. The inventive method includes, inter alia, providing a trench mask serving the dual role as a mask for the body layer formation and as a mask for trench etching. The trench mask defines a patterned oxide layer which includes a plurality of openings at predetermined distances away from the scribe line of the MOSFET structure. During fabrication, diffusion material for the body layer is implanted through the openings of the patterned oxide layer. Thereafter, the implanted material is side-diffused and merged together as one continuous body layer at a distance away from the scribe line. Using the same patterned oxide layer as a shield, trenches are anisotropically etched in the substrate. The MOSFET structure as formed requires no separate mask for delineating the active body region away from the scribe line, resulting in substantial reduction of fabrication steps. The consequential benefits are lower manufacturing costs and higher production yields, with no sacrifice in device performance.

These and other features and advantages of the invention will be apparent to those skilled in the art from the following detailed description, taken together with the accompanying drawings, in which like reference numerals refer to like parts.

DESCRIPTION OF THE DRAWINGS

FIG. 6 is a partial top plan view of another cell arrangement of the trenched gate MOSFET structure of the invention;

FIG. 6A is a cross-sectional side view taken along the line 6A—6A of FIG. 6;

FIG. 7 is a partial top plan view of yet another cell arrangement of the trenched gate MOSFET structure of the invention; and FIG. 7A is a cross-sectional side view taken along the line 7A—7A of FIG. 7.

DETAILED DESCRIPTION OF THE INVENTION

Figure 1A:
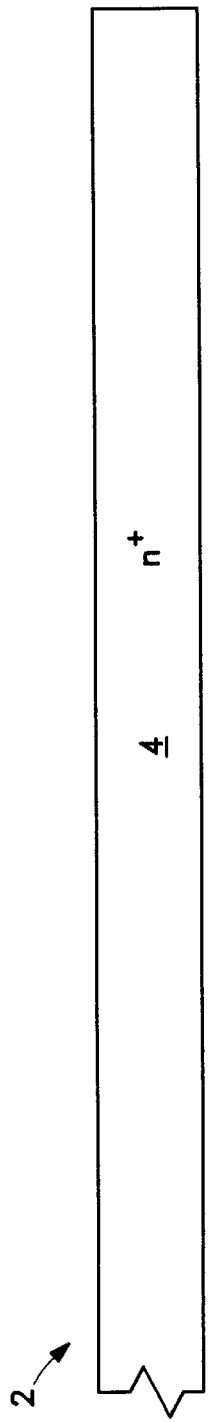
FIG. 1A–1R, as described above, are sequential views schematically illustrating the conventional method of fabricating a trenched MOSFET structure.
Figure 1B:
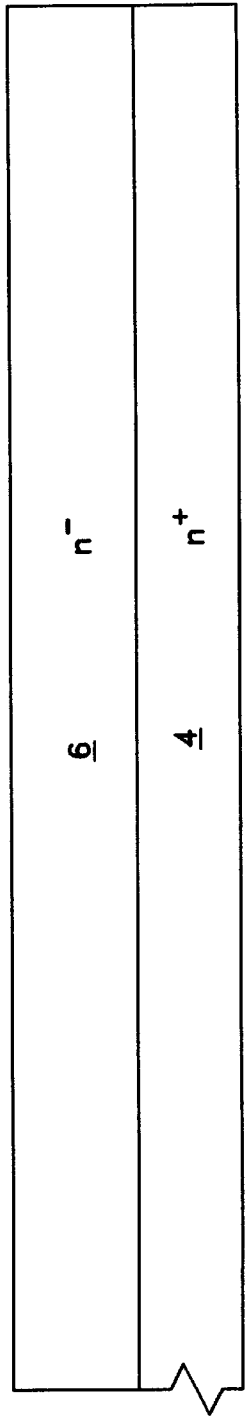
Figure 1C:
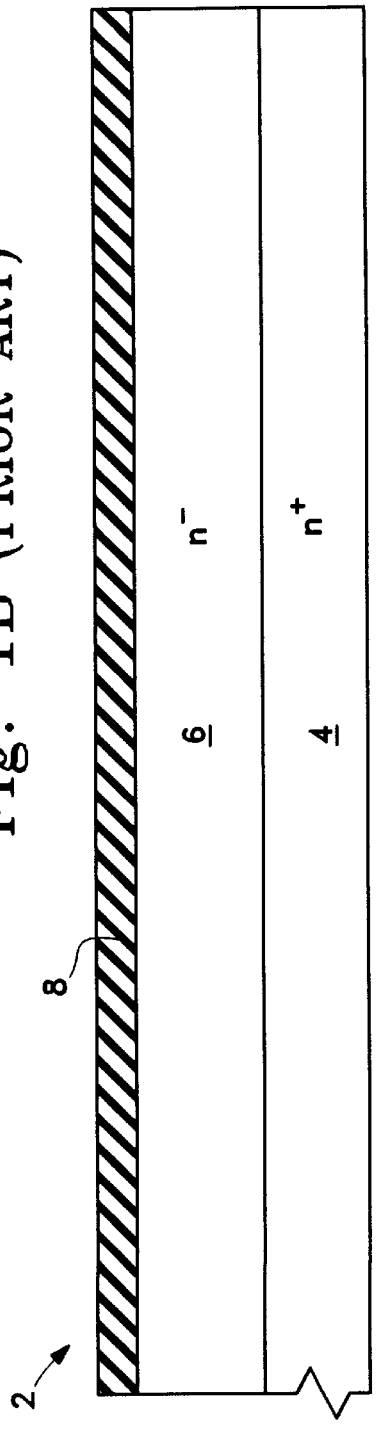
Figure 1D:
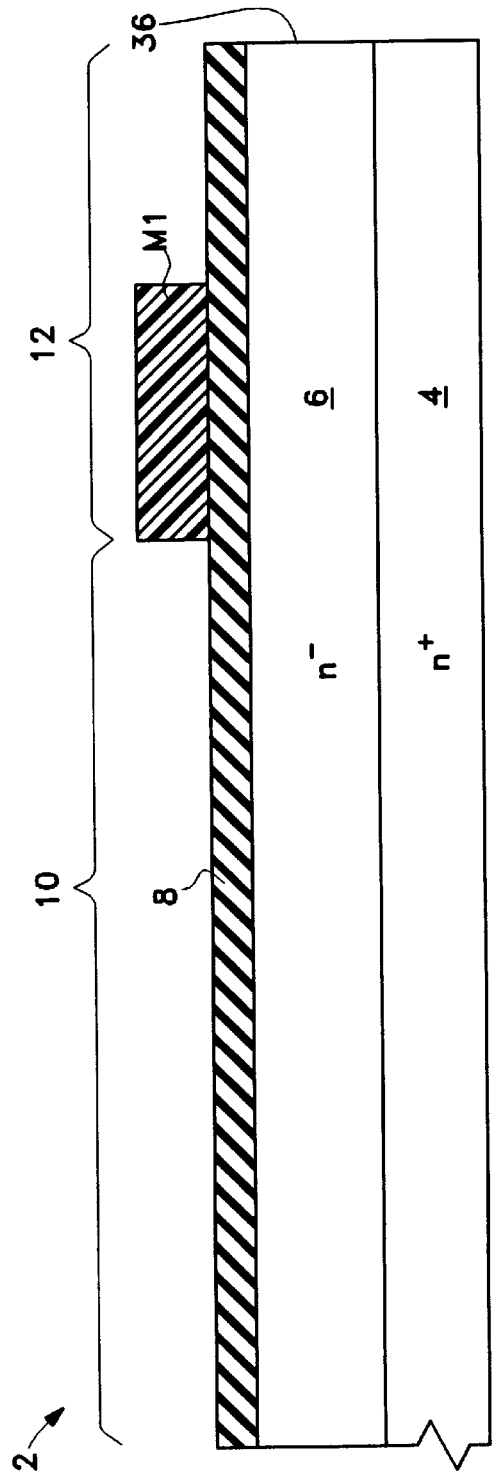
Figure 1E:
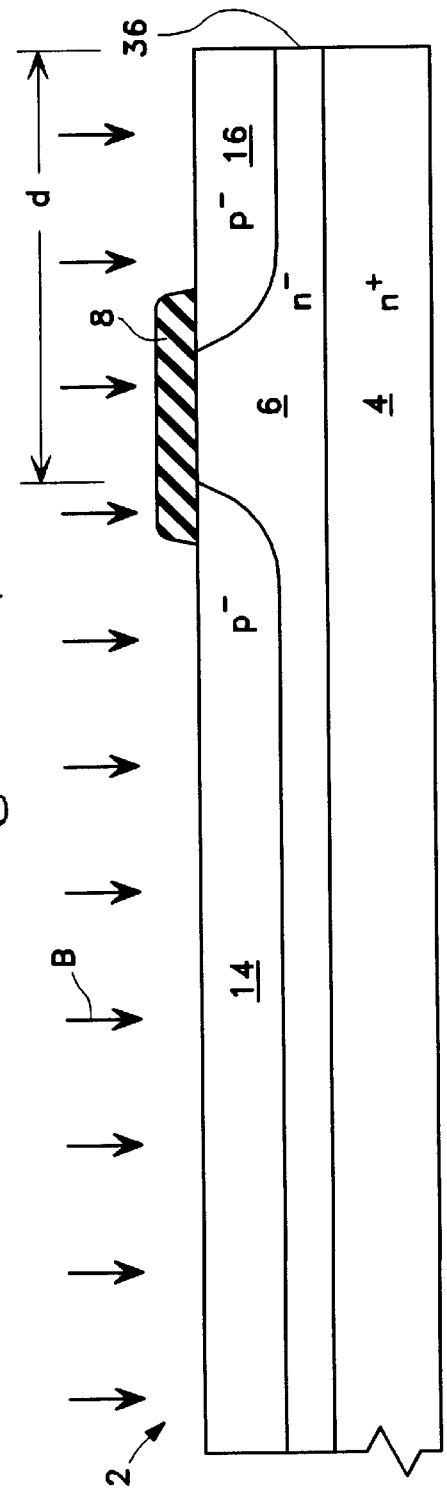
Figure 1F:
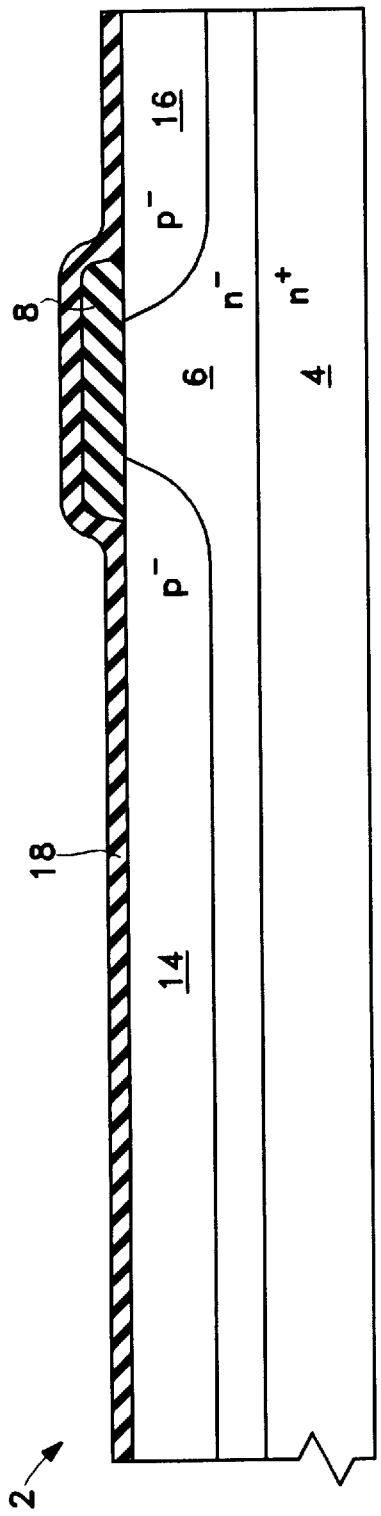
Figure 1G:
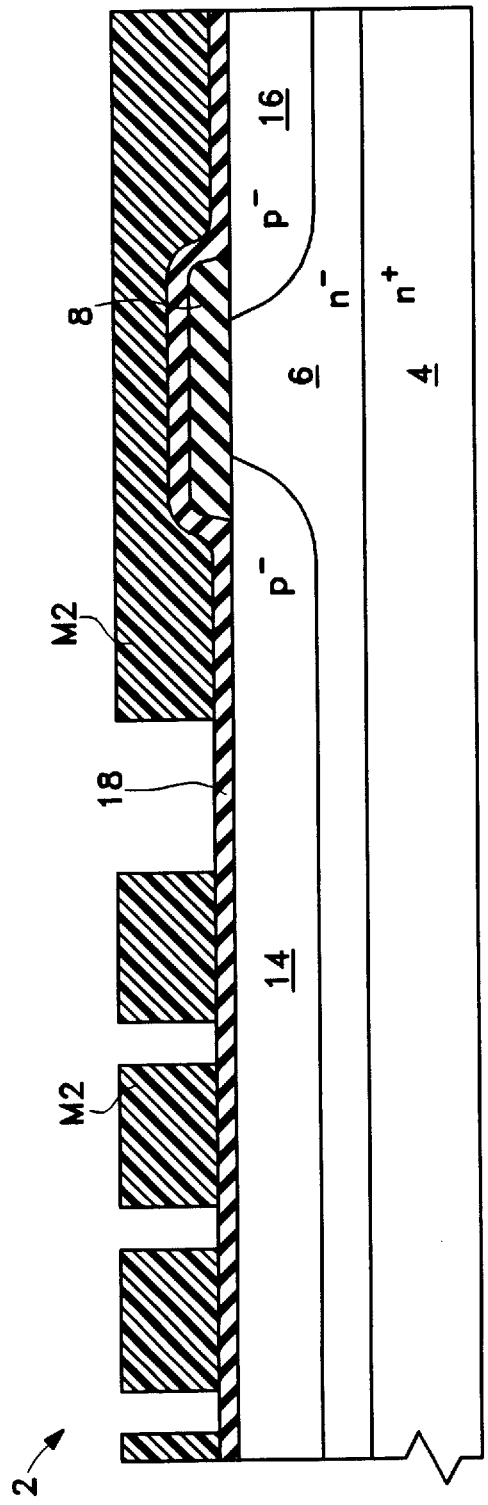
Figure 1K:
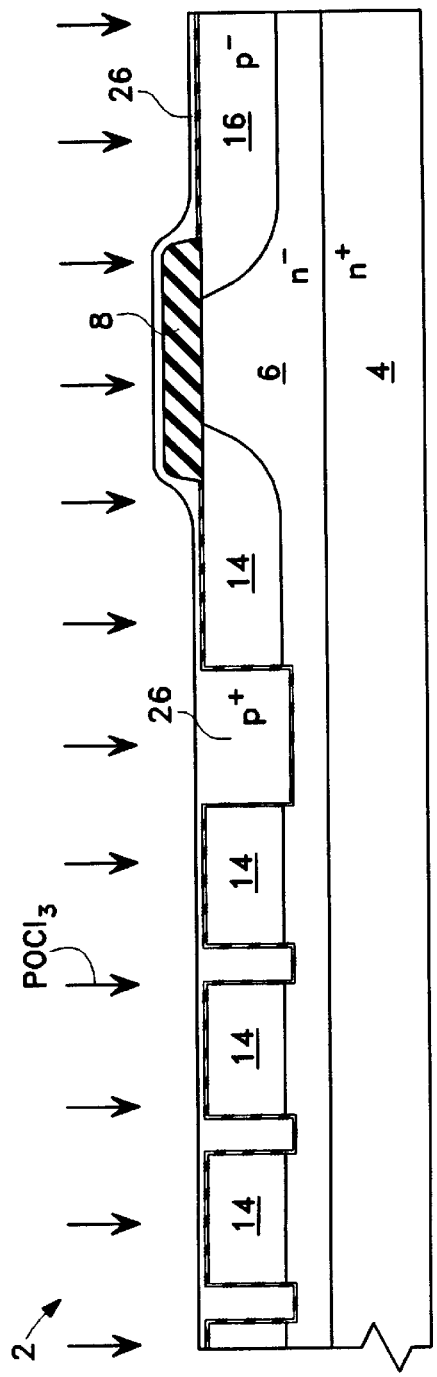
Figure 1L:
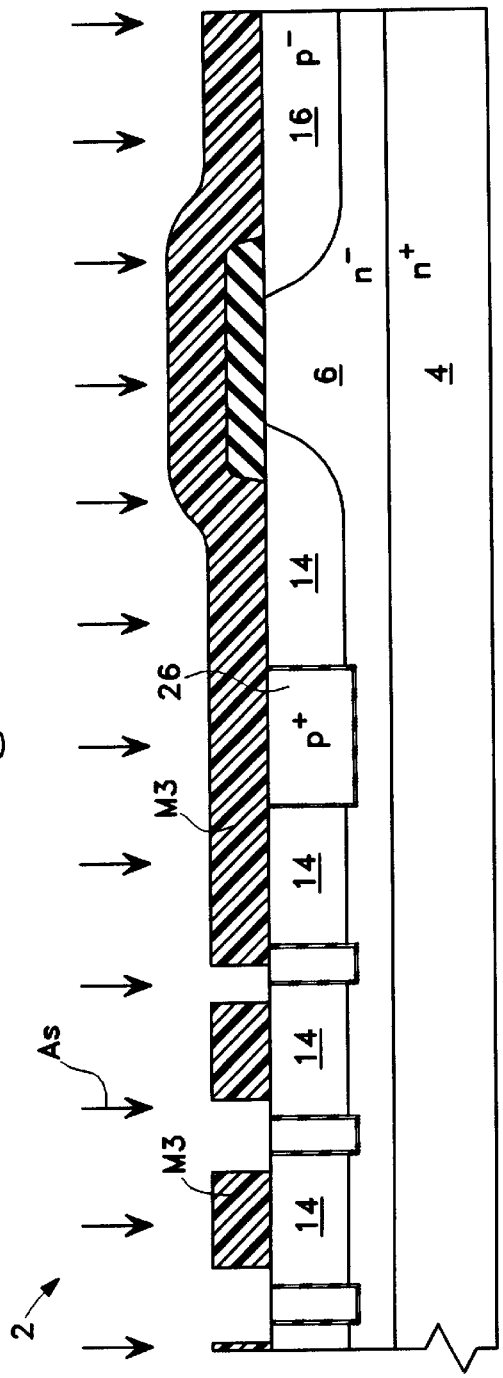
Figure 1M:
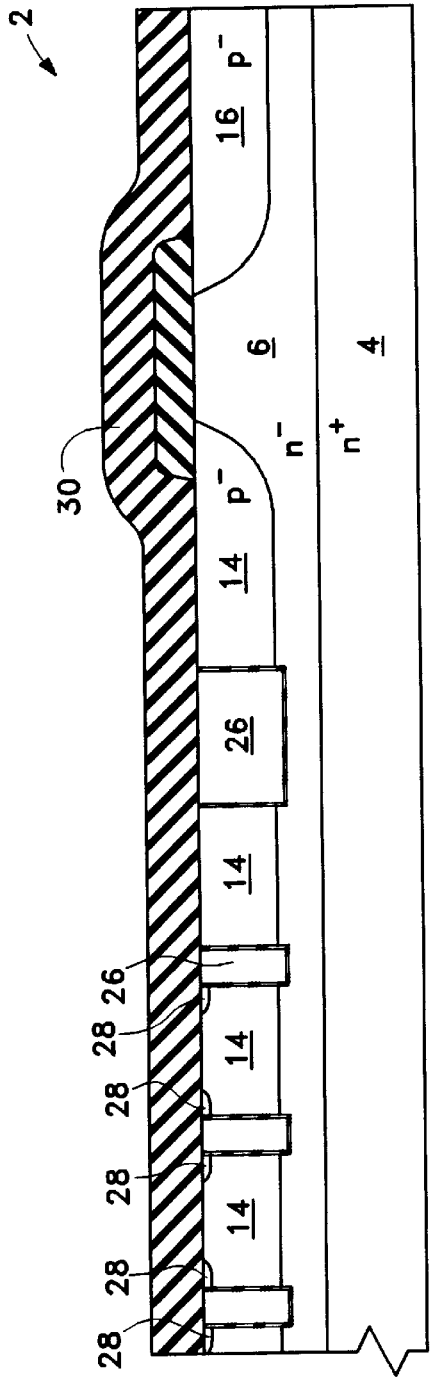
Figure 1N:
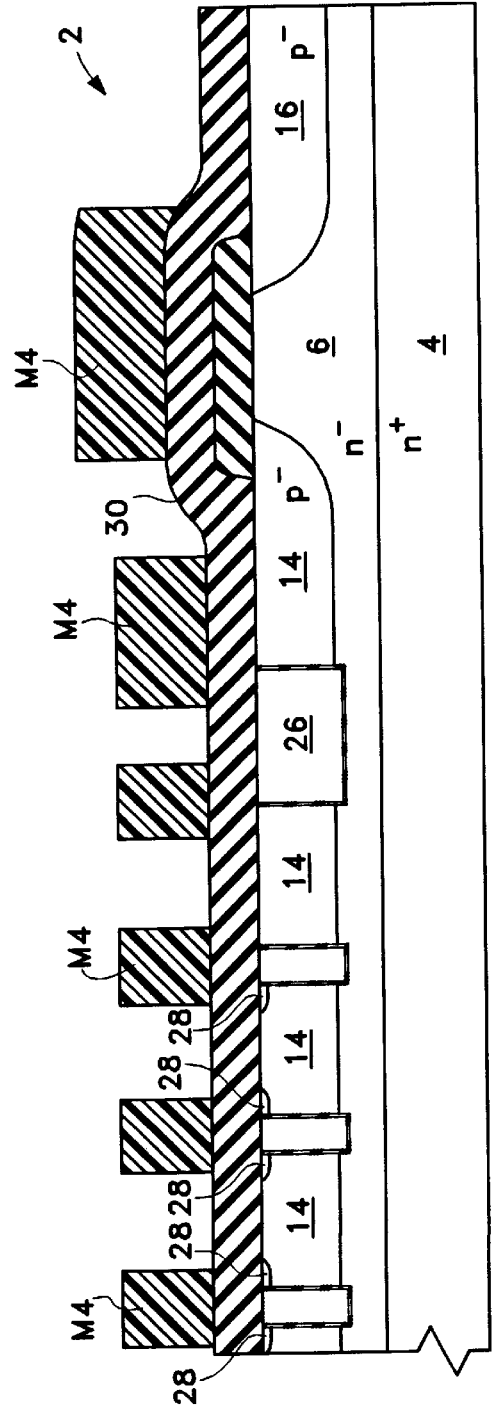
Figure 1O:
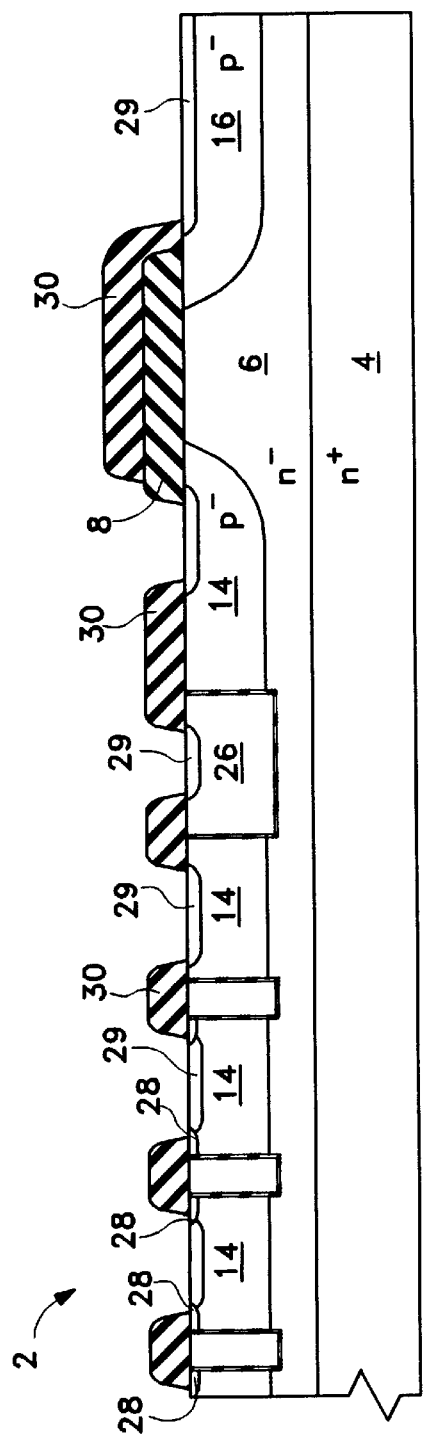

Prior to the description of the invention, reference is returned back to FIGS. 1D–1F. The reason why the active body layer 14 needs to be spaced at a distance d from the scribe line 36 is herein explained. As shown in FIGS. 1D and 1E, the first mask M1 defines the field oxide layer 8 which in turn delineates the active body layer 14 and the termination body layer 16. In the design of a field effect transistor, the body region, such as the regions 14 shown in FIGS. 1E–1P should never reach the scribe line 36 of the structure 2. The scribe line 36 is a physical cut line separating the semiconductor dies in a finished wafer. The crystal structure at the interior portions of the wafer 4, and the subsequent layers built thereon, are normally orderly in nature. However, the same may not be said of the vicinities adjacent to the scribe line 36, which are normally crowded with sites of highly energetic dangling bondings with unpredictable energy states. No active devices should be built at these sites with the highly unstable characteristics. If active transistor cells are fabricated at these sites, the transistors possibly would be riddled with intolerable leakage current. Worst of all, these sites are normally triggering locations for avalanche breakdown. For these reasons, during the ion implantation process, the patterned field oxide layer 8 (FIG. 1E) blocks the boron ion B, thereby providing a layer break which prevents the active body layer 16 from reaching the scribe line 36. The formation of the field oxide layer 8 necessitates a mask M1 (FIG. 1D) with the associated masking and patterning steps. The method of the present invention provides a novel approach in avoiding the masking and patterning steps as mentioned above, and is hereinafter described.

Figure 2A:
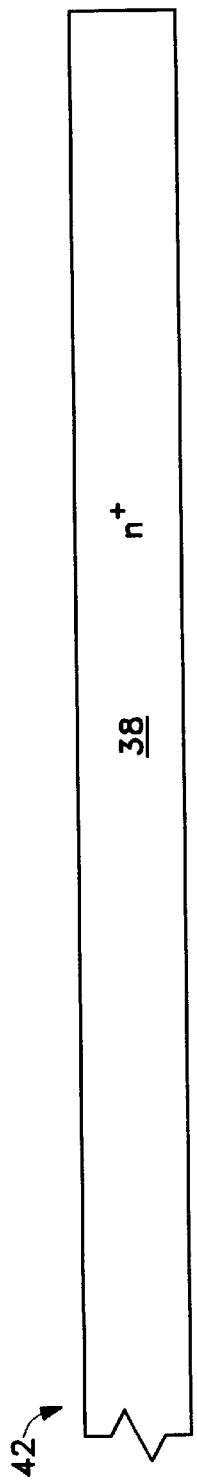
FIG. 2A–2S, are sequential views schematically illustrating the preferred method of fabricating of the trenched MOSFET structure of the invention.
Figure 2B:
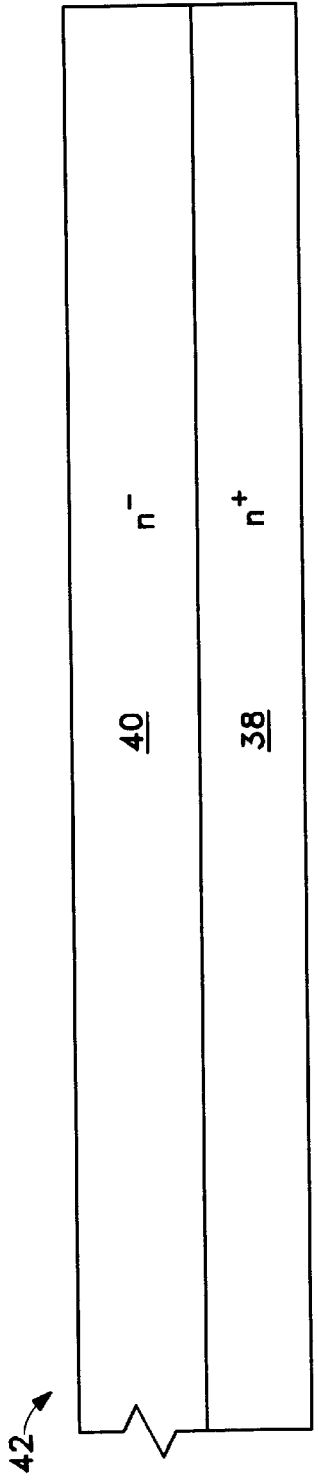
Figure 2C:
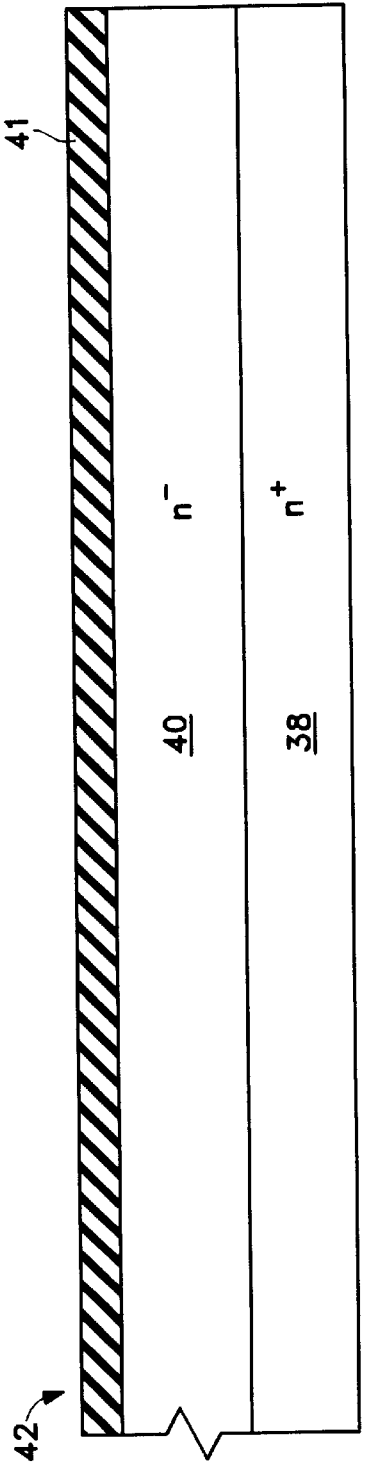

Reference is now directed to FIGS. 2A–2S. In the preferred method, the fabrication process starts with providing a n-type silicon wafer 38 with a <1,0,0> crystal orientation and a resistivity of between 0.001 Ωcm–0.007 Ω-cm, for example, as shown in FIG. 2A. An epitaxial layer 40 with a resistivity of approximately between 0.1 Ω-cm–2.0 Ω-cm is then grown atop the base wafer 38 to a thickness of about 3 μm to 20 μm. The resultant structure 42 up to this step is shown in FIG. 2B. An oxide layer 41 is then grown atop the epitaxial layer 40 under an ambient temperature of between 900° C.–1,100° C. to a thickness of approximately 1,000–8,000 Å as shown in FIG. 2C.

The oxide layer 41 needs to be patterned. A photoresist layer MI is first spun atop the oxide layer 41. Conventional techniques of masking and etching are employed to selectively open windows 48A and 48B in the photoresist layer MI. The windows 48A and 48B are respectively relied on for the formation of active and inactive trenches which will be explained later in this specification. The structure 42 up to this step is as shown in FIG. 2D.

Using the patterned photoresist layer MI as a shielding mask, the structure 42 is then subjected to the standard technique of either dry or wet etch. In the preferred method, the dry etch process is used, in which the etchant is plasma. Should the wet etch method be preferred hydrofluoric acid (HF) can be used as etchant. Either the dry or wet etchant attacks the oxide layer 42 but not the photoresist layer MI. Windows 48A and 48B in the photoresist MI is then transferred to the oxide layer 42 as windows 50A and 50B, respectively. The resultant structure up to this step is shown in FIG. 2E.

Figure 2F:
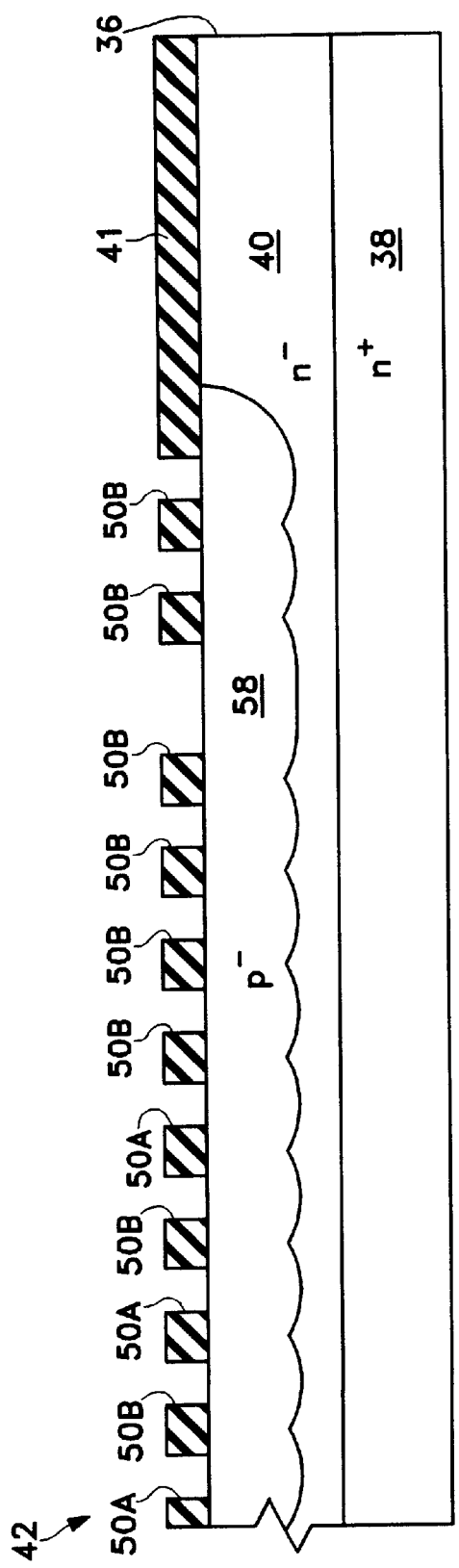

The structure 42 is then ion-implanted with boron (B) under an implant potential of approximately 30 KeV–100 KeV at a dosage of approximately $2\times10^{13}$ cm$^{-2}$ to $2\times10^{14}$ cm$^{-2}$, as shown in FIG. 2E. The implanted boron 52 stays at the bottom of each oxide windows 50A and 50B at the planar surface 54 of the structure 42. The structure 42 is then undergone a diffusion cycle at a temperature range of approximately 1,100° C.–1,150° C., for a time duration of between 5 minutes to 3 hours. The implanted ions 52 in each window 50A or 50B at the planar surface 54 diffuse radially in the epitaxial layer 40 in the direction 56 as shown in FIG. 2E. After the diffusion cycle, the diffused boron under each window 50A or 50B merges together with its adjacent counterpart resulting in a merged body layer 58 as shown in FIG. 2F.

Figure 2G:
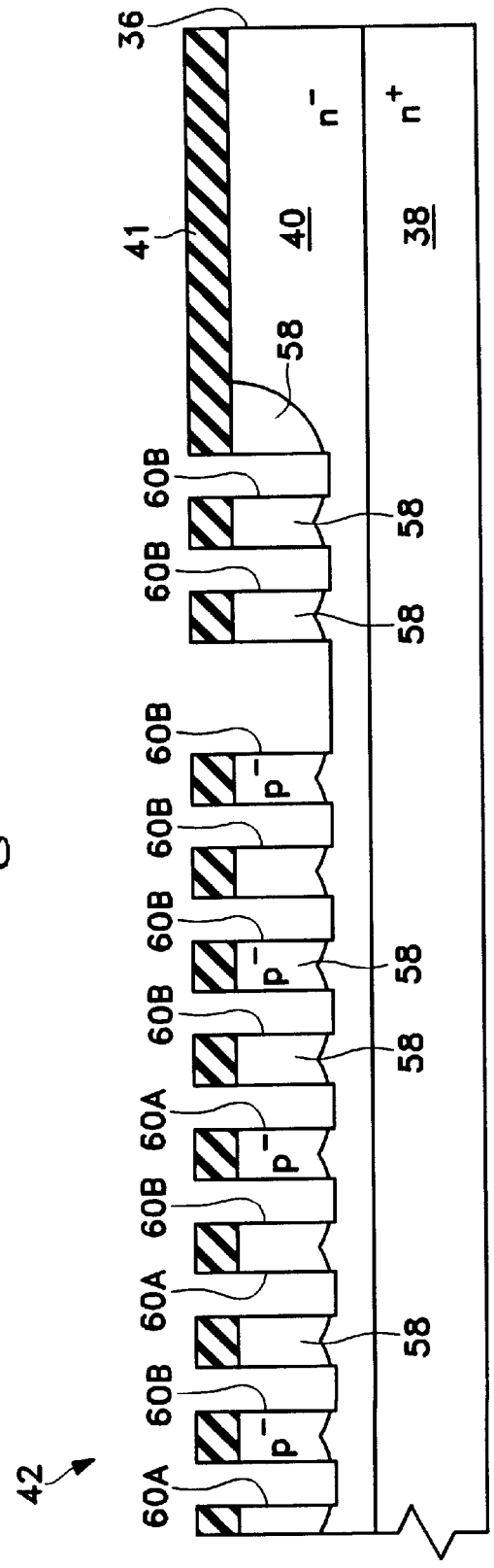

Using the same oxide layer 41 as a masking layer, the structure 42 is then subjected to the standard technique of dry anisotropic etching by exposing the structure to a plasma (not shown) for the formation of trenches 60A and 60B as shown in FIG. 2G.

It here should be pointed out that masking steps of the mask MI are relied upon to provide two important milestones of the fabrication process, namely, the deposition of the body layer 58 away from the scribe line 36 and the formation of the trenches 60A and 60B. This approach should be contrasted with the prior art method as described previously. In the conventional method, two separate masks and the associated masking and patterning steps are used to accomplish the corresponding results of the inventive method.

Attention is now directed back to FIG. 2G. After the step of trench etching, the oxide layer 41 is removed. What follows is the step of forming gate oxide layers by lining the trenches 60A and 60B with insulating material. First, the trenches 60A and 60B have to undergo a sacrificial oxidation process. Basically, the structure 42 is exposed to an oxidation agent of either oxygen ($O_2$), if the dry method is employed, or steam ($H_2O$), if the wet method is preferred, under an ambient temperature of approximately between 900° C.–1,100° C. The resultant structure 42 up to this step is shown in FIG. 2H. The grown sacrificial oxide layer 62 is then lightly etched away for the purpose of securing a smooth silicon surface in the trenches 60A and 60B as a prelude for subsequent gate oxide growth. The method of wet etch can be applied for the removal of the sacrificial oxide layer 62. The step of gate oxide growth is then carried out by exposing the structure 42 to either dry or wet agents as described above, under an ambient temperature of between 900° C.–1,100° C. to a thickness of approximately 300 Å–2,000 Å. The resultant structure 42 with a grown gate oxide layer 64 is shown in FIG. 2I.

Figure 2K:
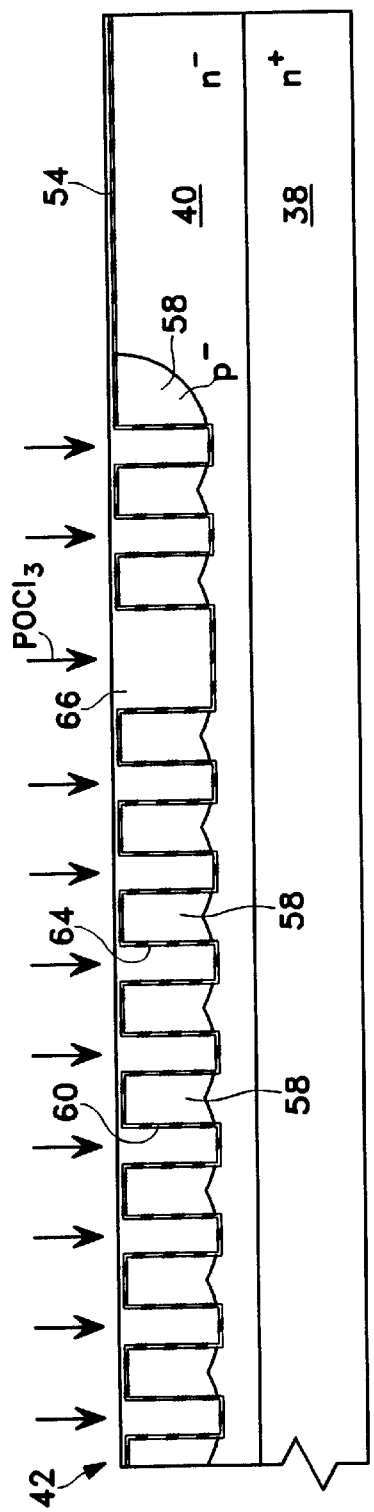
Figure 2L:
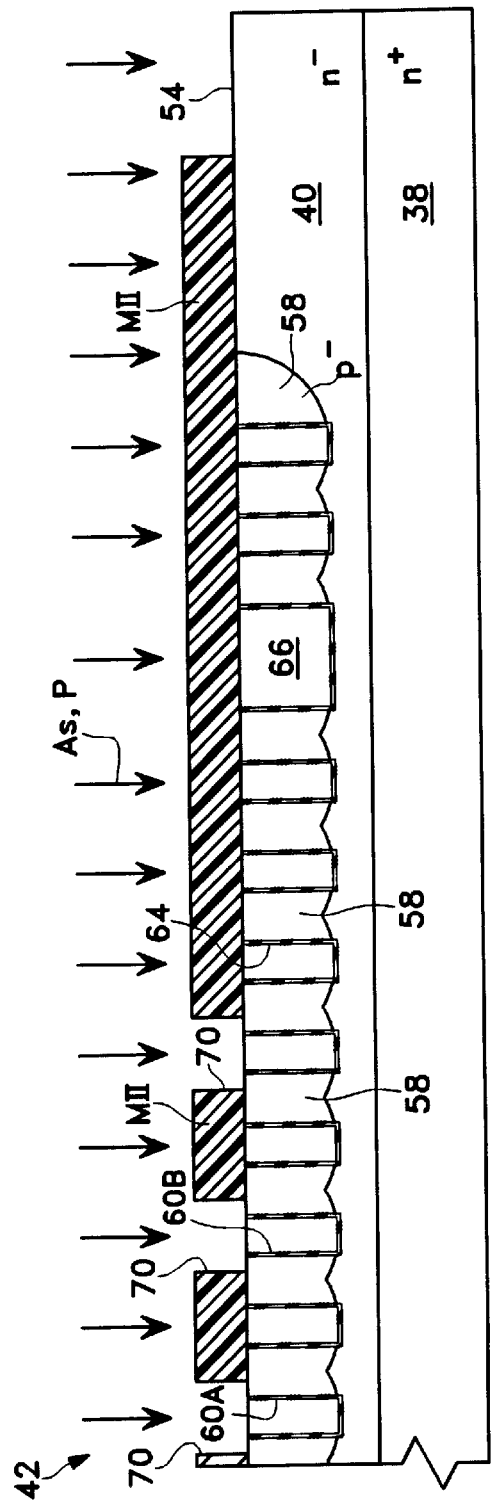

The trenches 60A and 60B need to be filled with conductive material. In the preferred method, the trenches 60A and 60B are filled with polycrystalline silicon 66 by the conventional method of chemical vapor deposition (CVD) to a thickness of approximately 1.5 $\mu$m to 3.0 $\mu$m above the planar surface 54. The step of either mechanical or chemical planarization then follows. In the preferred method, the dry etch method is used. The plasma etches away the polycrystalline silicon 66 to a thickness of approximately 1,000 Å–2,500 Å above the planar surface 54. The resultant structure 42 up to this step is shown in FIG. 2K. The remaining polycrystalline silicon 66 is then doped with phosphorus oxychloride ($POCl_3$) to a sheet resistivity of approximately 10 $\Omega/\square$–40 $\Omega/\square$ under an ambient temperature of about 950° C. The remaining polycrystalline silicon 18 is further chemically etched until the surface is flush with the planar surface 54 as shown in FIG. 2L.

What follows is the deposition step of the source 68 layer (FIG. 2M). First, another photoresist mask MII with source layer windows 70 is formed on the top of the structure 42. Either arsenic (As) or phosphorous (P) is then ion-implanted into the masked structure 42 with an implant dosage of approximately $3\times10^{15}$ cm$^{-2}$ to $1\times10^{16}$ cm$^{-2}$ under an implant potential of between 40 KeV to 100 KeV as shown in FIG. 2L. The photoresist mask MII is then removed. Again, the source implant is subjected to a drive-in cycle under a temperature of between 900° C.–1,000° C. for a duration of between 10 minutes to 60 minutes. The resultant structure 42 with the deposited source layer 68 is shown in FIG. 2M.

Thereafter, a passivation oxide layer 72 is deposited on the top of the planar surface 54 to a thickness of approximately 1,000 Å to 1.0 $\mu$m via the CVD method as shown in FIG. 2N. The passivation oxide layer 72 is then undergone a densification process under a temperature of about 900° C.–950° C. for 30 minutes to 60 minutes. A contact mask MIII is then laid atop the passivation oxide layer 72. After patterning of the mask MIII, the resultant structure 42 up to this step is shown in FIG. 2O.

The passivation oxide layer 72 is then etched through the patterned mask MIII using an etchant which attacks the passivation oxide layer 72 but not the patterned photoresist mask MIII. If the dry etch method is used, the etchant is plasma. If the wet etch method is adopted, the etchant can be HF. Thereafter, the mask MIII is removed, the resultant structure up to this step is shown in FIG. 2P.

Using the patterned passivation oxide layer 72 as a shielding mask, boron is then implanted into the body layer 58 for the formation of the contact layer 74 (FIG. 2N) which is of the p-type conductivity. After a proper drive-in cycle, the contact layer 74 is formed as shown in FIG. 2Q.

A metal layer 76 is then deposited by the sputtering method on the top of the planar surface 54 covering the passivation oxide layer 72. In the preferred method the material for the metal layer 76 is aluminum (Al). A metal mask MIV is then laid atop the metal layer 76. After proper patterning, the resultant structure up to this step is shown in FIG. 2R. The metal layer 76 is then selectively etched via the metal mask MIV. Finally, a drain metal layer 78 is deposited onto the bottom side of the silicon wafer 38. The resultant structure up to this step is shown in FIG. 2S.

Not shown in FIGS. 2A–2S is the deposition of another masking step via a 5th mask MV, called the bonding pad mask, to selectively expose the metal layer 76 for the attachment of bonding wires after a top protective insulating layer is deposited over the structure 42.

Figure 1P:
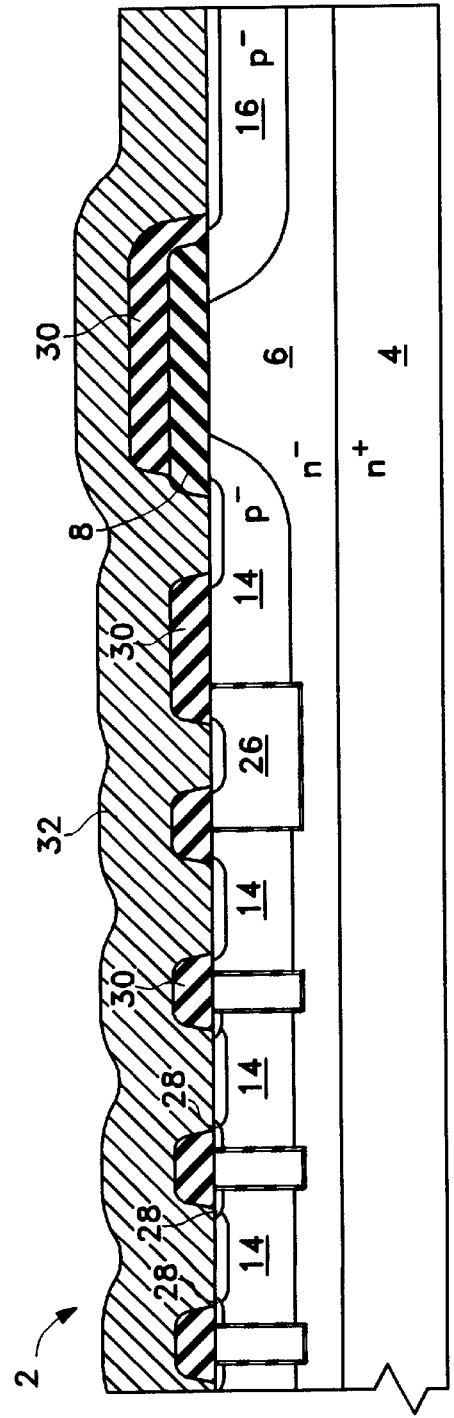
Figure 1Q:
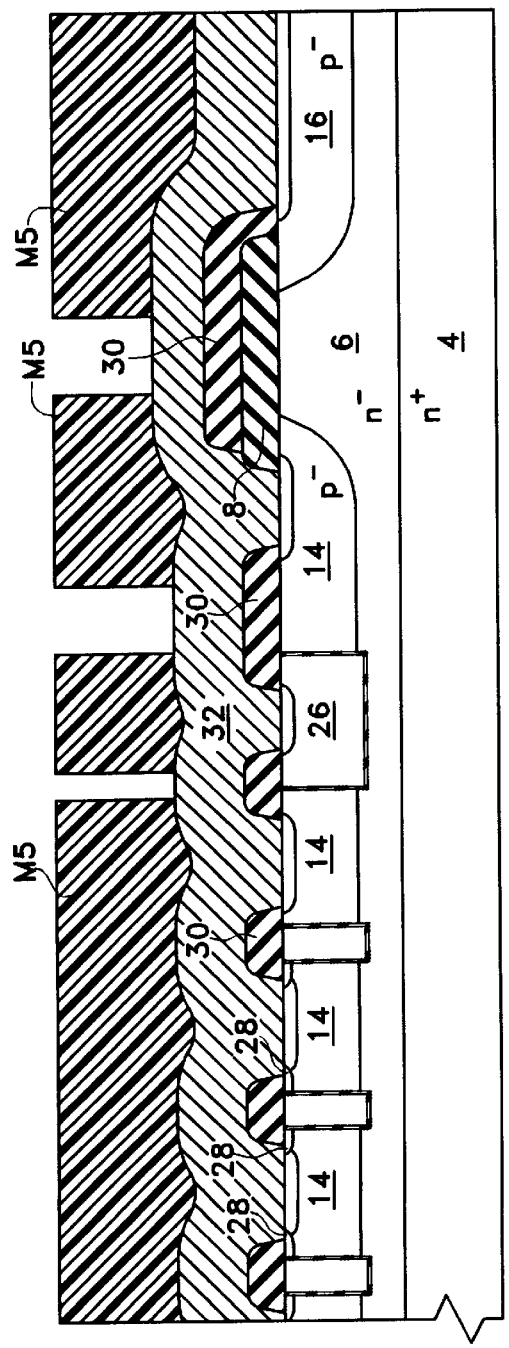
Figure 1R:
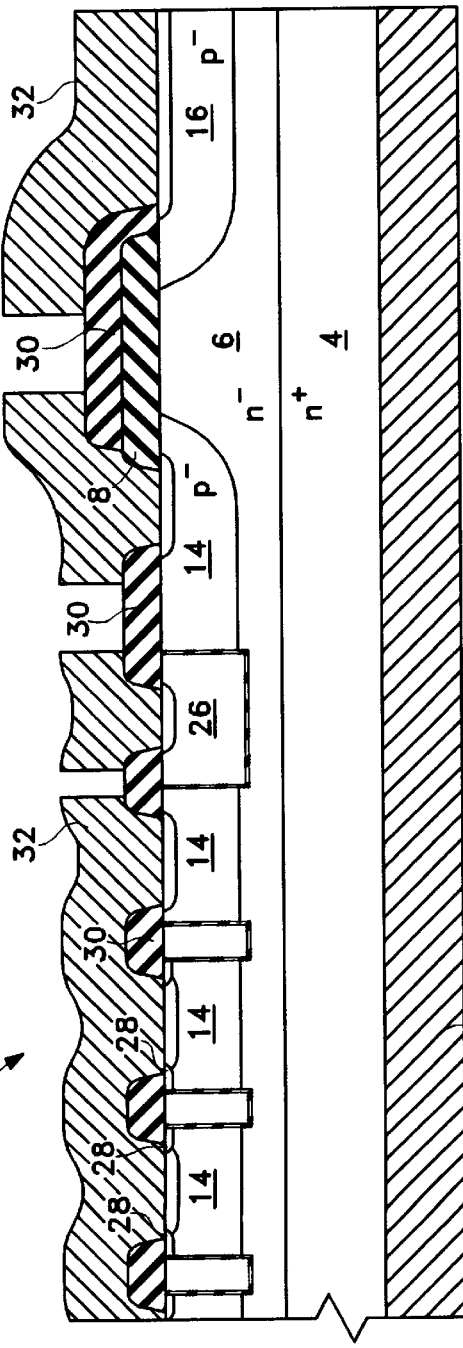

By virtue of relying on the mask MII to perform the dual functions of providing the active body layer 58 remote from the scribe line 36, and of acting as a template shield for the etching of trenches 60, a photoresist mask with the associated steps are eliminated. Specifically, excluding the bonding pad masks, the conventional fabrication process requires six masks, namely M1–M6 as shown in FIGS. 1A–1P. As a comparison, the method of the invention needs only five masks, namely, MI–MV to accomplish the same as shown in FIGS. 2A–2S. As mentioned before, the consequential benefits are substantial. There is first the reduction of manufacturing costs due to the eliminated mask and the various patterning and etching steps associated with the mask. Moreover, there is a significantly reduced chance of contamination of the structure during fabrication and consequently providing higher production yield.

Figure 3:
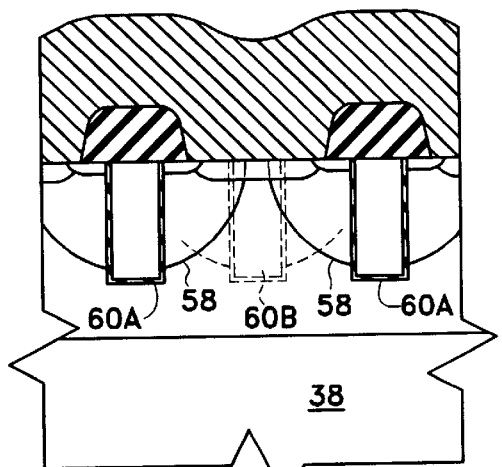
FIG. 3 is a cross-sectional side view showing the side-diffusion effect of the body layer without an inactive trench.
Figure 4:
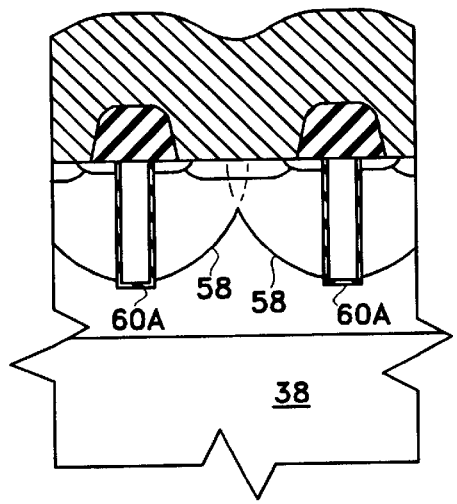
FIG. 4 is a cross-sectional side view showing the effect of using a high resolution photolithographic process in the formation of the merged body layer without the inactive trench.

In the preferred method, the trenches are arranged alternatively with one active trench 60A adjacent to an inactive trench 60B as shown in FIG. 2S. The trenches 60A are rendered active by electrically connecting the conductive material 66 in each trench 60A to a gate runner (not shown). Likewise, the trenches 60B are made inactive by electrically isolating the conductive material 66 in each trench 60B from the gate runner (not shown). In the preferred method, the inactive trenches 60B are tied to the ground potential through the source metal layer 76 as shown in FIG. 2S. The reason for this arrangement is due mainly to the lateral resolution limit of the photolithographic process. The inactive trenches 60B are implemented to avail a diffusion window such that the active body layer 58 can be merged together as one continuous layer. During the deposition of the mask MI shown in FIG. 2D, without the windows 48B which eventually provide the inactive trenches 60B, the active body layer may be fabricated as isolated as shown in FIG. 3, instead of continuous. However, with a higher resolution photolithographic process at higher manufacturing costs, it is possible that the inactive trenches can be eliminated all together resulting in a continuous body region 58 as shown in FIG. 4.

Figure 5:
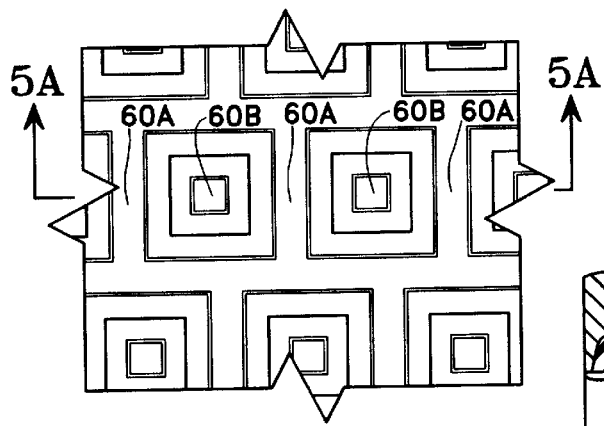
FIG. 5 is a partial top plan view of one cell arrangement of the trenched gate MOSFET structure of the invention.
Figure 5A:
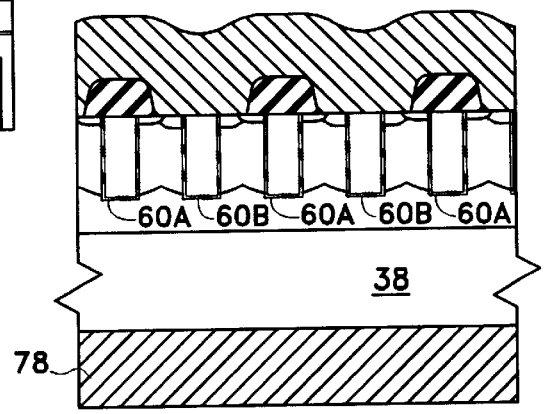
FIG. 5A is a cross-sectional side view taken along the line 5A—5A of FIG. 5.

Furthermore, various trench pattern can be implemented in accordance with the invention. For example, shown in FIG. 5 is a top view of a MOSFET structure in which the cells are arranged in am array format. FIG. 5A is the cross-sectional view taken along the line 5A—5A of FIG. 5. In FIG. 5 and the subsequent FIGS. 6 and 7, the top layers, such as the metal layer 76 and the passivation oxide layer 72, are removed for the purpose of illustration. FIG. 6 shows another pattern in which there are two inactive trenches 60B corresponding to each active trench 60A. FIG. 7 is a MOSFET structure in which the cells are in the form of stripes. FIG. 7A is a cross-sectional view taken along the line 7A—7A of FIG. 7.

The finished structure 42 as shown in FIG. 2S also includes a few unused trenches labeled 60B1–60B3. The reason is that there is normally more strayed hole current near the termination region 12. The parasitic NPN transistor inherent with an active MOSFET cell located at the region with high a level of stray hole current is susceptible to be turned on and consequently causes damages. To ensure reliability, the trenches 60B1–60B3 are left idle.

Finally, other changes are possible within the scope of the invention. For example, the contact regions 74 need not be present in the structure 42. Without the contact region 74, the resultant structure may lack robustness in performance, but is nevertheless a functional trenched gate MOSFET. Moreover, the conductivity types of the layers may very well be different from that as depicted in the specification. In addition, the device fabricated in accordance with the invention need not be a power MOSFET. It can well be used for other purposes, such as a dynamic random access memory (DRAM) cell, or a charge-coupled-device (CCD), to name just a few. It will be understood by those skilled in the art that these and other changes in form and detail may be made therein without departing from the scope and spirit of the invention.

What is claimed is:

1. A method of forming a semiconductor structure, comprising the steps of:
   (a) providing a semiconductor substrate having a major surface;
   (b) disposing a masking layer having at least two openings above said major surface;
   (c) depositing material in said substrate through said at least two openings;
   (d) diffusing said material in said substrate downwardly and sidewardly so as to merge the material under each of said at least two openings together;
   (e) etching said substrate through said openings by using an etchant which does not significantly etch said masking layer to form at least two cavities in said substrate under said at least two openings;
   (f) lining said cavities with insulating material; and
   (g) filling said cavities with conductive material.

2. The method as set forth in claim 1 wherein said step of lining said cavities with insulating material includes lining said cavities with silicon dioxide, and said step of filling said cavities with conductive material includes filling said cavities with polycrystalline silicon.

3. The method as set forth in claim 1 wherein said masking layer being a first masking layer, said method further comprising the steps of:
   (e) removing said first masking layer from said major surface;
   (f) disposing a second masking layer having at least one opening above said major surface; and
   (g) forming a source layer in said substrate by depositing material of said source layer through said at least one opening of said second masking layer.

4. The method as set forth in claim 3 wherein said semiconductor structure being a field effect transistor structure having a source, a gate and a drain, wherein said source includes said source layer, said gate includes said conductive material in said cavities, and said drain includes said substrate.

5. The method as set forth in claim 1 wherein said step (a) includes providing said semiconductor substrate with a n-type conductivity, and said step (c) includes depositing material of a p-type conductivity through said at least two openings.

6. The method as set forth in claim 1 wherein said substrate includes a scribe line surrounding said semiconductor structure, and wherein step (b) further comprising the substep of disposing said at least two openings at predetermined distances away from the scribe line.

7. A method of forming a semiconductor cell array, comprising the steps of:

(a) providing a semiconductor substrate of a first conductivity type, said substrate having a major surface;

(b) disposing a masking layer having a plurality of openings above said major surface;

(c) depositing material of a second conductivity type through said plurality of openings;

(d) diffusing material of said second conductivity type in said substrate sidewardly and downwardly so as to merge the material of said second conductivity type under each of said openings together;

(e) etching said substrate through the openings of said masking layer to form a plurality of trenches in said substrate;

(f) lining said trenches with insulating material; and (g) filling said trenches with conductive material.

8. The method as set forth in claim 7 wherein said masking layer being a first masking layer, said method further comprising the steps of:

(h) removing said first masking layer from said major surface;

(i) disposing a second masking layer having a plurality of openings above said major surface; and (j) forming a layer of said first conductivity type in said layer of said second conductivity type by depositing material of said first conductivity type through the openings of said second masking layer.

9. The method as set forth in claim 8 wherein said semiconductor cell array being an array of field effect transistors having a common source, a common drain and a common gate, wherein said common source includes said diffusion layer of said first conductivity type formed in step (j), said common drain includes said semiconductor substrate, and said common gate include said conductive material in said trenches formed in step (g).

10. The method as set forth in claim 9 further including the step of assigning said trenches as active trenches by electrically connecting the conductive material in said active trenches to said common gate, and as inactive trenches by electrically isolating the conductive material in said inactive trenches from said common gate.

11. The method as set forth in claim 10 wherein said substrate includes a scribe line surrounding said cell array, and wherein step (b) further comprising the substep of disposing said openings at predetermined distances away from said scribe line.

* * * * *